United States Patent [19]

Laughlin, Jr. et al.

[11] 4,160,247
[45] Jul. 3, 1979

[54] MEANS FOR HOUSING AN ELECTRICAL CONTROL

[75] Inventors: James P. Laughlin, Jr., Evansville, Ind.; Mark C. Loessel, St. Joseph, Mich.; Robert H. O. Kraemer, Evansville, Ind.

[73] Assignee: Whirlpool Corporation, Benton Harbor, Mich.

[21] Appl. No.: 765,498

[22] Filed: Feb. 3, 1977

[51] Int. Cl.² ............................................... G08B 21/00
[52] U.S. Cl. .................................. 340/693; 174/52 R; 340/585; 361/399
[58] Field of Search ............ 340/227 R, 227.1, 228 R, 340/585, 693, 664; 174/5 R, 52 R; 361/399, 391, 380; 206/333; 62/129

[56] References Cited
U.S. PATENT DOCUMENTS

| 3,175,126 | 3/1965 | Hardwick | 361/399 |
| 3,967,164 | 6/1976 | Valle | 174/52 R |
| 3,976,985 | 8/1976 | Schalow et al. | 340/227 R |

Primary Examiner—Glen R. Swann, III

Attorney, Agent, or Firm—Wegner, Stellman, McCord, Wiles & Wood

[57] ABSTRACT

A housing enclosing a control for use in an electrical apparatus having structure defining a control space arranged to preclude access to the control in the housing when the housing is in the control space. The apparatus may include a connecting device for connecting the apparatus to an alternating current power supply for normal electrical operation of the apparatus. The control may comprise an alarm device which causes operation of the alarm upon a malfunctioning of the apparatus, and includes a battery for operating the alarm in the event of a failure of the power supply. The battery is removably connected to a circuit board portion of the control and a structural portion of the electrical apparatus prevents replacement of the battery and exposure of the control circuit when the housed control is in the control space and connected to the alternating current power source. The control housing is arranged to expose a portion of the battery for observation by the user when the housed control is in the control space.

16 Claims, 5 Drawing Figures

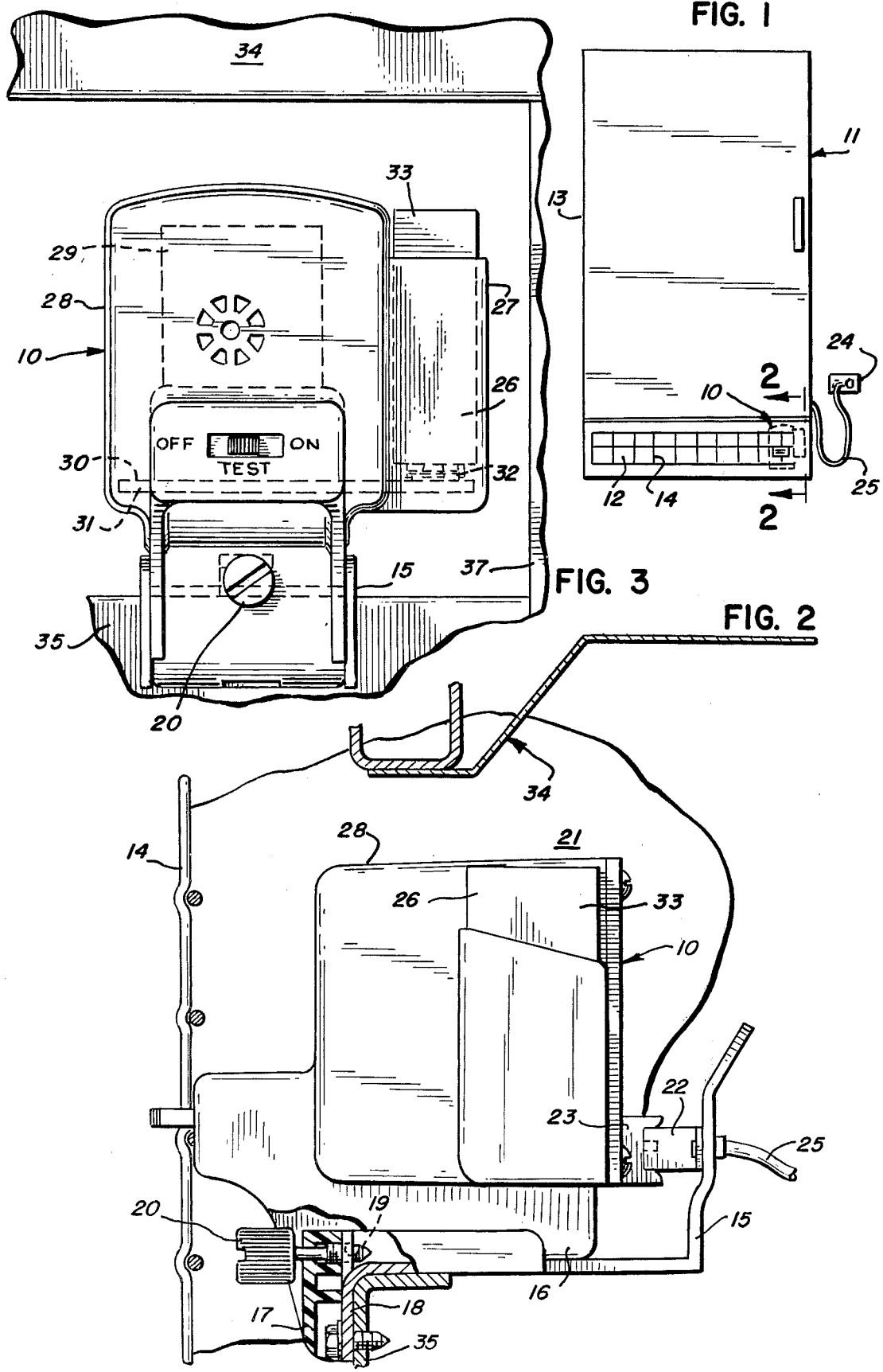

MEANS FOR HOUSING AN ELECTRICAL CONTROL

BACKGROUND OF THE INVENTION

1. Technical Field

This invention relates to electrical apparatus and in particular to means for housing a control means for use in such apparatus.

2. Background Art

It is often desirable to replace or service an electrical component, such as a battery, which is associated with a control for an electrical apparatus, and for such purpose, the component is removed from the control. The present invention requires that the control be disconnected from its alternating current power source before replacement of the component is permitted. More specifically, the invention is concerned with preventing undesirable contact by the user of energized portions of the control circuit which are exposed by removal of the component while the control circuit is energized, thereby to prevent injury to the user.

A number of housing and interlock devices have been developed for controlling energization of control panels and the like in appliances and other electrical apparatus. Illustratively, in U.S. Pat. No. 3,967,164 of Michael A. Valle, a service access control panel is provided which is arranged for facilitated access such as for servicing the components on the rear of the panel. The panel includes a shelf supported from the rear and a pair of slides permitting the panel to be displaced forwardly from a flush position on the appliance and be pivoted about a horizontal axis for access to the components. A power interrupter is associated with the panel to disconnect the supply of power to the panel once the panel is moved from its normal position.

In U.S. Pat. No. 3,693,089 of Thomas R. Hutchinson et al, a housing assembly is provided for a miniature radio apparatus or the like wherein a battery is provided for operation thereof, which battery is connected to a printed circuit board by means of a bracket which surrounds the battery and is connected to the circuit board.

Bryant W. Fisher, in U.S. Pat. No. 3,339,117, shows a printed circuit board wherein different components are exposed and other components are housed in an enclosure carried on the board.

C. T. Hardwick, in U.S. Pat. No. 3,175,126, discloses an apparatus wherein control elements are mounted on separable portions of the housing with an interlocking switch arrangement breaking the power supply to the control components when a portion of the housing is swung to a service position.

In U.S. Pat. No. 2,980,753 of George L. Nolter, a battery contact assembly is disclosed wherein a plurality of battery connectors are mounted to a panel of a housing for connecting a plurality of batteries in series relationship within an outer housing.

In U.S. Pat. No. 2,672,506 of Herbert H. Schulz, a television receiving set is arranged for mounting in the wall of a room and includes means for automatically disconnecting the apparatus from the alternating current power supply when the receiver is removed from the wall as for servicing. As such, the apparatus of the Schulz patent utilizes the conventional television interlock concept of a removable rear wall of the television receiver having power supply interlock means carried thereby for disconnecting the power supply to the control circuitry of the receiver when the rear wall is removed as for servicing of the control circuitry.

Harry E. Adams, in U.S. Pat. No. 1,618,967, shows a rheostat wherein electrical contacts are provided on a separate housing portion from the housing portion carrying the resistance unit.

SUMMARY OF THE INVENTION

The present invention comprehends an improved means for housing an electronic control circuit or device and a removable component associated with the control, such as a battery, wherein replacement of the removable component is prevented unless the housing itself is removed from a position it normally occupies within a space defined by the enclosure of an electrical apparatus. The term "control", as used herein, refers generally to any electrical circuit, component or device which may be associated with an electrical apparatus while enclosed in a separate housing.

More specifically, the present invention comprehends providing means for preventing the replacement of the removable component when the housed control is within a control space defined by portions of the electrical apparatus enclosure. The removable component may be partially exposed, so as to be visible when the housing is in the control space. The removal preventing means comprises the housing configuration and a structural member suitably disposed within the control space to prevent removal of the removable component while yet permitting ready removal of the entire housed control from the control space. Interlock means are associated with the control housing so as to cause disconnection thereof from the alternating current power source, which normally operates the control, when the control is removed from the control space. When the housed control is removed from the control space, the removable component may be replaced without danger of exposing the user to live electrical components of the control.

In the illustrated embodiment, the control is a portion of an alarm device for providing a warning as to a malfunction of the associated electrical apparatus. Where the apparatus comprises a refrigeraton apparatus, the malfunction may comprise a high temperature condition within a refrigerated compartment. Thus, when a high temperature condition occurs for reasons other than a failure of the alternating current power supply, the power supply may operate the alarm through the control. However, where the malfunctioning of the apparatus is due to a failure of the power supply, the alarm is operated by a battery associated with the control. Periodic servicing and/or replacement of the battery may be effected by suitably removing the housed control and battery from within a control space defined by the refrigeration apparatus enclosure, or cabinet. The battery and control are, in turn, carried in a separate housing preventing access to the electrified components of the control as long as the housed battery and control are in the control space within the appliance enclosure. Thus, the user is prevented from inadvertently engaging electrified portions of the control.

When the housed control is removed from the control space, interlock means associated therewith automatically effect a disconnection of the control from the alternating current supply, permitting the user to service the battery without danger relative to contract with exposed control elements, such as the contacts exposed by removal of the battery.

In the illustrated embodiment, structural members associated with the refrigeration apparatus enclosure are disposed in overlying and adjacent relationship to the battery when the battery is within the control space so as to prevent replacement of the battery from the control means and housing at that time. Removal of the housed control means from the control space permits the battery to be readily removed from the housing as the structural members no longer preclude access thereto.

Thus, the present invention comprehends an extremely simple and economical improved electrical control housing means wherein a control circuit and battery are housed suitably in association with an enclosure of an associated electrical apparatus so as to prevent replacement of the battery from the control circuit while the control circuit is energized from an alternating current power supply, while yet permitting ready removal of the battery when the housed control is removed from the control space within the electrical apparatus in which it is normally housed.

BRIEF DESCRIPTION OF THE DRAWINGS

Other features and advantages of the invention will be apparent from the following description taken in connection with the accompanying drawing wherein:

FIG. 1 is a front elevation of an electrical apparatus having a control embodying the invention;

FIG. 2 is a fragmentary enlarged vertical section thereof taken substantially along the line 2—2 of FIG. 1;

FIG. 3 is a fragmentary front elevation thereof;

DESCRIPTION OF THE PREFERRED EMBODIMENT

Figure 4:
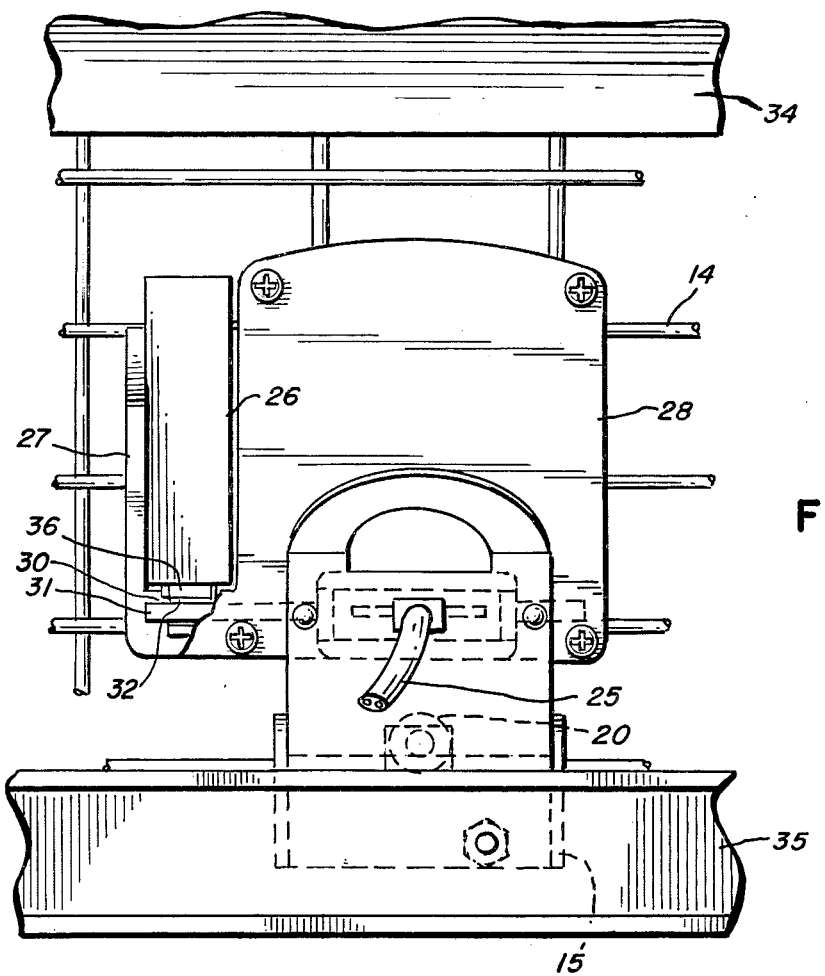
FIG. 4 is a fragmentary rear elevation thereof.

In the exemplary embodiment of the invention as disclosed in the drawing, an alarm control generally designated 10 is provided for signaling a malfunction of an electrical apparatus such as a freezer type refrigeration apparatus generally designated 11. The alarm may be mounted in an apparatus space 12 defined by a portion of the outer enclosure 13 of the appliance 11. The apparatus space may be closed by a removable front grill 14 for permitting access to the apparatus space and alarm 10, when desired.

As shown in FIG. 2, alarm 10 is removably carried on a support 15 which is affixed to a structural member 35 associated with the enclosure 13. The alarm is provided with a carrier 16 having a depending front wall portion 17. Support 15 is provided with a corresponding front wall portion 18 having a threaded securing element 19 for receiving a thumb screw 20 passed through the carrier front wall 17 to lock the control 10 in position on support 15 in a control space portion generally designated 21 (FIG. 2) of apparatus space 12.

Support 15 further carries a separable power connector 22 and alarm 10 further carries a mating separable power connector 23 which are engaged when the alarm is installed on the support in control space 21 for energizing the alarm from a conventional alternating current power source, such as wall plug 24, by means of a power cord 25 forming a portion of the appliance 11. Thus, when the alarm 10 is installed in normal operative position on support 15 in control space 21, the alarm is energized from the alternating current power supply normally powering the appliance.

However, as discussed above, alarm 10 is provided for indicating a malfunction of the appliance, such as a high temperature condition where the appliance comprises a refrigeration apparatus. Suitable remote sensing means (not shown) are connected to the alarm for this purpose. Since one condition which may cause such a high temperature malfunctioning of the refrigeration apparatus comprises the failure of the alternating current power supply, it is desirable to arrange the alarm to provide a warning when there is no alternating current power supply for operating the alarm. Thus, it is conventional to provide a battery in association with such an alarm for providing the desired warning under such conditions. As discussed above, the battery, which in the illustrated embodiment may comprise a common 9-volt transistor radio battery 26, must be serviced or replaced from time to time. During such servicing or replacing of the battery it is desirable to prevent access to electrified portions of the control. More specifically, it is desirable to disconnect the alternating current power supply connectors 22 and 23 whenever battery 26 is removed from the alarm 10.

As shown in FIG. 3, the battery 26 is mounted in a battery compartment portion 27 of a housing 28 for housing the alarm 10. Housing 28 is carried on carrier 16 and may further include an alarm device 29 providing an auditory signal when energized.

As best seen in FIG. 4 a control circuit 30, which in the illustrated embodiment may be provided on a circuit board 31, is retained within the housing 28. The circuit board may be provided with suitable connectors 32 for direct removable connection of the terminals 36 of battery 26. Thus, the battery 26, circuit 30, and board 31 effectively define an electrical control.

As further shown in FIGS. 2 and 3, the battery includes an upper portion 33 which is exposed outwardly of the housing portion 27 so as to be viewable through the front grill 14 of the appliance enclosure 13. Thus, the user of the appliance is apprised of the existence of the battery in the alarm device whereby notice may be taken of the requirement of replacement or servicing of the battery periodically.

Housing portion 27 is configured such that the battery 26 is gripped and frictionally held in place when its terminals 36 are engaged with the circuit board connectors 32. This can be accomplished by dimensioning the battery space defined by housing portion 27 such that the battery is gripped on opposite sides and by forming the housing of a material that has a sufficient resilience to accommodate slight dimensional variations in the batteries used. By way of example, the housing may be formed of polyvinylchloride (PVC) material. If desired, an inwardly projecting rib (not shown) may be provided on housing portion 27 to ensure good frictional engagement of the battery.

As further shown in FIGS. 2 and 3, the appliance enclosure 13 includes a cabinet deck and flange shown generally at 34 which overlies the control space 21 and, more specifically, overlies the battery portion 33. Enclosure 13 further includes a cabinet side rail 37 which is directly adjacent housing portion 27. The position of the housing in relationship to these structural members effectively precludes replacement of the battery from the housing compartment 27 when the alarm is disposed in the control space 21. As indicated above, the alarm is connected to the alternating current power supply 25 through the connectors 22 and 23 under such conditions and, thus, the arrangement of the flange 34 so as to prevent replacement of battery 26 from the housing effectively precludes exposure of the electrified circuit 30 at such time.

Figure 5:
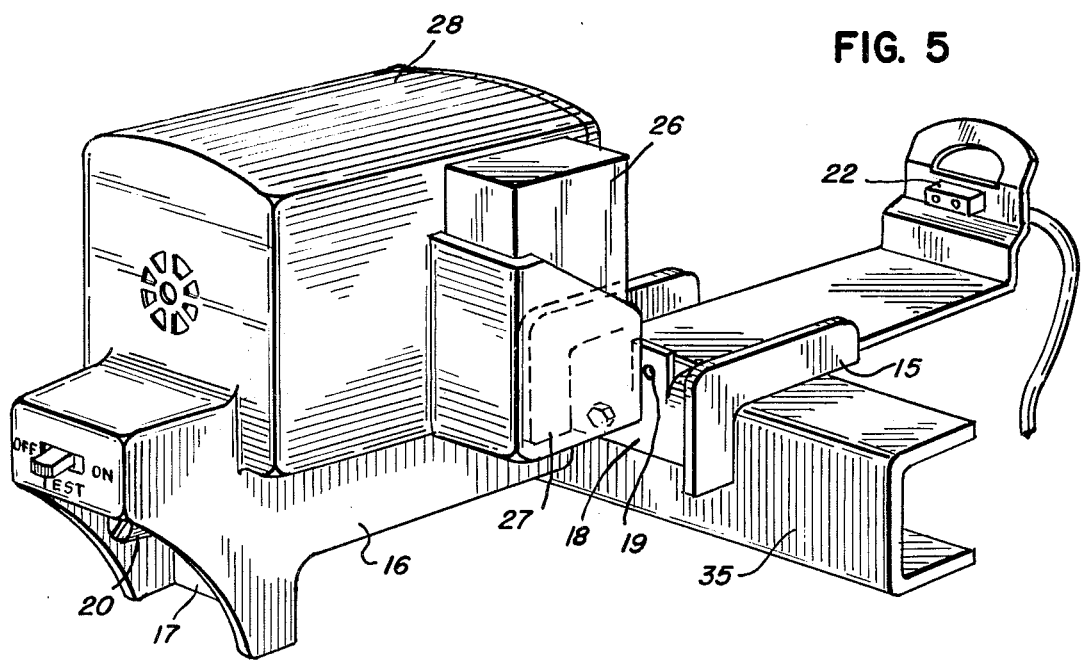
FIG. 5 is a fragmentary perspective view illustrating the arrangement of the control in the withdrawn disposition permitting servicing of the battery thereof.

As indicated above, however, the alarm 10 is arranged to be supported on support 15 so as to permit forward movement for removal thereof from the control space 21 on carrier 16. Thus, as shown in FIG. 5, when the alarm is disposed forwardly of the control space 21 and enclosure 13 of the appliance, battery 26 is exposed for facilitated replacement. Under these conditions, connectors 22 and 23 are spaced apart so as to positively preclude energization of the circuit from the alternating current power supply. Thus, while a portion of the control circuit 30 on circuit board 31 is exposed upon removal of battery 26 from the compartment 27, no injury can occur to the user as the control circuit is de-energized at this time.

Removal of the alarm 10 from control space 21 may be effected by simple removal of the grill 14 from enclosure 13, removal of the thumb screw 20, and the sliding of the carrier portion 16 of alarm 10 on the support 15 to the forwardly exposed position as discussed above. Return of the alarm to operative position within control space 21 after replacement of battery 26 is effected by reversing the above steps.

Thus, the present invention comprehends the provision of a housing for a control circuit from which a removable component may be replaced only when the housed control circuit is disconnected from an alternating current power supply normally provided for operating the control circuit. The alarm housing is removably disposed within the main enclosure of the appliance and a structural element of the appliance enclosure is utilized to prevent access to within the alarm housing as well as to prevent removal of the battery therefrom under unsafe conditions. The structural arrangement of the present invention provides improved, safe servicing of the appliance while yet being extremely simple and economical of construction. In addition, an improved mounting arrangement is provided for a replaceable component, such as a battery.

The forgoing disclosure of specific embodiments is illustrative of the broad inventive concepts comprehended by the invention.

Having described the invention, the embodiments of the invention in which an exclusive property or privilege is claimed are defined as follows:

1. In an electrical apparatus having structural means defining a partially enclosed control space, the improvement comprising:
    electrical control means provided with a control circuit and a replaceable component;
    housing means housing said control means; and
    means for removably mounting the housed control means in said control space, said structural means being arranged to preclude access to said control circuit in said housing means when said housed control means is in said control space, said replaceable component precluding access to a portion of said control circuit when said component is associated with said control circuit.

2. The electrical apparatus of claim 1 wherein said structural means prevents removal of said component from said housing when said housed control means is in said control space.

3. The electrical apparatus of claim 1 wherein said circuit means is exposed within said housing when said component is removed, said structural means and said housing preventing removal of said component when said housed control means is mounted in said control space.

4. The electrical apparatus of claim 1 wherein said replaceable component comprises a battery and said housing is arranged to expose a portion of the battery to view when the housed control means is in said control space.

5. The electrical apparatus of claim 1 wherein said apparatus includes means for connecting said control means to a source of electrical power as an incident of said housed control means being disposed in said control space.

6. The electrical apparatus of claim 1 wherein said apparatus includes means for connecting said control means to a source of electrical power as an incident of said housed control means being disposed in said control space, and said replaceable component comprises a battery for operating said control means as an incident of failure of said power source when said housed control is disposed in said control space.

7. An electrical apparatus comprising: an electronic circuit means;
    a replaceble electrical component connected to said circuit means;
    housing means including a first portion enclosing said electronic circuit means and a second portion partially enclosing said replaceable component;
    first electrical connection means carried by said housing for connection to a source of power;
    mounting means for mounting said housing, said mounting means including second electrical connection means for engagement with said first electrical connection means; and
    means defining a control space, said mounting means being configured and disposed within said space such that whenever said first and second electrical connection means are engaged, a portion of said control space means separate from said housing prevents replacement of said replaceable component, said replaceable component further precluding access to a portion of said control circuit when connected thereto.

8. The electrical apparatus of claim 7 wherein said replaceable component comprises a battery removably mounted in electrical contact with said circuit means.

9. The electrical apparatus of claim 7 wherein said first and second electrical connection means comprise mating plug-in type electrical connectors.

10. The electrical apparatus of claim 7 wherein said portion of the control space means incudes a structural member which overlies said replaceable component and obstructs its path of removal when said housing means is positioned such that said first and second electrical connection means are engaged.

11. The electrical apparatus of claim 7 wherein said circuit means includes third electrical connection means for connection to said replaceable component and said housing second portion includes means for frictionally engaging and positioning said replaceable component in electrical contact with said third electrical connection means.

12. In an electrical appliance having means for connection thereof to an alternating current power source, said appliance having structural means and enclosure means cooperatively defining a partially enclosed control space to which limited access may be had, the improvement comprising:

control means including an alarm device and electrical circuit means for controlling operation of said alarm device;

housing means for housing said control means; and means for removably mounting the housed control means in said control space, said structural means, enclosure means, and housing means being cooperatively arranged to preclude access to said control means in the housing means when said housed control means is in said control space, said alarm device providing a warning alarm indicating a malfunctioning of the appliance.

13. The electrical appliance of claim 12 wherein said appliance comprises a refrigeration appliance and said malfunctioning comprises a high temperature condition in the appliance.

14. The electrical appliance of claim 12 wherein said control means includes a removable battery connected to said circuit means, said circuit means being exposed within said housing when the battery is removed, said structural means preventing removal of said battery from said housing when said housed control means is in said control space, said battery powering said alarm device to provide a warning alarm in the event a failure of the power source occurs precluding operation of the alarm from said power source.

15. The electrical appliance of claim 12 wherein said control means includes a circuit board carrying said circuit means and a battery removably connected to said circuit board, said structural means precluding replacement of said battery when the housed control means is in said control space.

16. The electrical appliance of claim 15 wherein said housing includes a portion which frictionally retains and positions said battery in connection with said circuit board.

* * * * *